(12) United States Patent
Kwok et al.

(10) Patent No.: US 9,653,152 B1
(45) Date of Patent: May 16, 2017

(54) LOW VOLTAGE HIGH SIGMA MULTI-PORT MEMORY CONTROL

(71) Applicant: QUALCOMM Incorporated, San Diego, CA (US)

(72) Inventors: Tony Chung Yiu Kwok, Irvine, CA (US); Changho Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/352,197

(22) Filed: Nov. 15, 2016

(51) Int. Cl.
*G06F 12/00* (2006.01)
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ... G11C 11/419; G11C 11/418; G11C 7/1075; G11C 11/406; G11C 11/40603
USPC ........................................................ 365/154
See application file for complete search history.

(56) References Cited

U.S. PATENT DOCUMENTS

| 6,333,881 | B1 | 12/2001 | Kusunoki et al. | |
| 7,151,706 | B2 | 12/2006 | Nakamura | |
| 7,388,408 | B2 | 6/2008 | Liu et al. | |
| 7,533,222 | B2* | 5/2009 | Leung | G11C 7/1075 711/149 |
| 7,903,475 | B2 | 3/2011 | Moore | |
| 9,443,575 | B2* | 9/2016 | Yabuuchi | G11C 11/418 |
| 2008/0005492 | A1* | 1/2008 | Leung | G11C 7/1075 711/149 |
| 2015/0098268 | A1* | 4/2015 | Yabuuchi | G11C 11/419 365/154 |

FOREIGN PATENT DOCUMENTS

CN            203799667 U       8/2014

* cited by examiner

*Primary Examiner* — Han Yang
*Assistant Examiner* — Xiaochun L Chen
(74) *Attorney, Agent, or Firm* — Chui-kiu Teresa Wong; Kenneth Vu (57) ABSTRACT

In an aspect of the disclosure, an apparatus is provided. In one aspect, the apparatus is a memory controller that includes a logic circuit configured to generate a select signal for selecting between first and second ports of a memory as a function of first and second port signals. Additionally, the memory controller includes a switch configured to connect and disconnect the first and the second port signals. In another aspect of the disclosure, the apparatus is a storage apparatus that includes a memory and a memory controller. The memory controller includes a latch configured to latch a first port selection signal to produce a first port signal and latch a second port selection signal to produce a second port signal. The memory controller also includes a switch configured to connect and disconnect the first and the second port signals and a logic circuit configured to generate a select signal.

21 Claims, 7 Drawing Sheets

LOW VOLTAGE HIGH SIGMA MULTI-PORT MEMORY CONTROL

BACKGROUND

Field

The present disclosure relates generally to memory circuitry, and more particularly, to memory control circuitry.

Background

An example static random access memory (SRAM) cell may include a pair of cross-coupled inverters, e.g., each formed from a pair of transistors. The cross coupled inverters may be used to store a bit in one of two stable logic states, e.g., a logic "1" or a logic "0." Each pair of transistors that may form an inverter may be one P-type metal-oxide-semiconductor (PMOS) transistor and one N-type metal-oxide-semiconductor (NMOS) transistor. By using a combination of a PMOS transistor and an NMOS transistor, static power consumption may be reduced because one of the transistors in each cross-coupled inverter is always off in both logic states.

A "bitcell," e.g., a single port SRAM cell, may be formed from six transistors. For example, a bitcell may have four transistors, e.g., two each for the pair of cross-coupled inverters. The bitcell may also have two additional transistors. The two additional transistors are used as access transistors. The access transistors may control access to the data in the bitcell during read and write operations. The access transistors may connected to a word line. The word line may be used to enable the access transistors.

Multiport memory cells may provide additional features that may make the operation of the memory cells more flexible. In other words, multiport memory cells may provide more read and write capabilities than a single port SRAM cell. For example, a multiport memory may include additional access transistors. The additional access transistors at each memory cell may provide additional access ports to the memory cell.

In a multi-port memory system, memory port selection information may be latched with pulse latches for every operation cycle. Multi-port memories may use multiple pulse latches to register their respective port selection states. Generally, there may be a variation between each pulse latch due to local environment and layout effects. Layout effects and silicon variations may have significant effects on signal integrity in the latest semiconductor device technologies. The layout effects and silicon variations may be more sensitive at low voltage operation. Variation between pulse latches may cause functional failures, resulting in low yields for multi-port memory systems configured got low voltage operation. Accordingly, minimizing operational variation between pulse latches may be advantageous.

SUMMARY

The following presents a simplified summary of one or more aspects in order to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, an apparatus is provided. The apparatus may be a memory controller. The memory controller may include a logic circuit configured to generate a select signal for selecting between a first port and a second port of a memory as a function of a first port signal and a second port signal. Additionally, the memory controller may include a switch configured to connect and disconnect the first port signal from the second port signal.

In another aspect of the disclosure, another apparatus is provided. The apparatus may be a memory controller. The memory controller may include a latch. The latch may be configured to latch a first port selection signal to produce a first port signal and latch a second port selection signal to produce a second port signal. The memory controller may include a switch configured to connect and disconnect the first port signal from the second port signal.

In another aspect of the disclosure, another apparatus is provided. The apparatus may be a storage apparatus. The storage apparatus may include a memory and a memory controller. The memory controller may include a latch. The latch may be configured to latch a first port selection signal to produce a first port signal and latch a second port selection signal to produce a second port signal. The memory controller may also include a switch. The switch may be configured to connect and disconnect the first port signal from the second port signal. The memory controller may also include a logic circuit. The logic circuit may be configured to generate a select signal for selecting between a first port and a second port of the memory as a function of the first port signal and second port signal.

It is understood that other aspects of apparatus and methods will become readily apparent to those skilled in the art from the following detailed description, wherein various aspects of apparatus and methods are shown and described by way of illustration. As will be realized, the aspects may be implemented in other and different forms and the aspects' several details are capable of modification in various other respects. Accordingly, the drawings and detailed description are to be regarded as illustrative in nature and not as restrictive in nature.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Acronyms and other descriptive terminology may be used merely for convenience and clarity and are not intended to limit any concept disclosed herein.

Various memories presented throughout this disclosure may be implemented as or in a stand-alone memory. Such aspects may also be included in an integrated circuit (IC) or system, or a portion of an integrated circuit or system (e.g., modules, components, circuits, or the like residing in an integrated circuit or part of an integrated circuit), or an intermediate product where an integrated circuit or system is combined with other integrated circuits or systems (e.g., a video card, a motherboard, etc.) or an end product (e.g., mobile phone, personal digital assistant (PDA), desktop computer, laptop computer, palm-sized computer, tablet computer, work station, game console, media player, computer based simulators, wireless communication attachments for laptops, or the like).

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements may be physical, logical, or a combination thereof. As used herein, two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not limit the quantity or order of those elements. Rather, these designations are used herein as a convenient method of distinguishing between two or more elements or instances of an element. Thus, a reference to first and second elements does not mean that only two elements can be employed, or that the first element must precede the second element. As used herein, references to the plural include the singular, and references to the singular include the plural.

Memories may include random access memory (RAM), static random access memory (SRAM), dynamic RAM (DRAM), synchronous dynamic RAM (SDRAM), double data rate RAM (DDRAM), read only memory (ROM), programmable ROM (PROM), erasable PROM (EPROM), electrically erasable PROM (EEPROM), a general register on a processor, flash memory, or any other suitable memory. Accordingly, all references to an SRAM are intended only to illustrate exemplary aspects of memory with the understanding that such aspects may be extended to a wide range of applications.

In a multi-port memory system, memory port selection information may be latched with pulse latches for every operation cycle. Multi-port memories may use multiple pulse latches to register the respective port selection states. Generally, there may be a variation between each pulse latch due to each pulse latch's local environment and layout effects. Layout effects and silicon variations may have significant effects on signal integrity in the latest semiconductor device technologies. The layout effects and silicon variations may be even more sensitive at low voltage operations. Variation between pulse latches may cause functional failures, resulting in low LV yields.

In an example, the latch states may be fed back to a tracking control. The tracking control may be a switch controller configured to control a switch that may short a first port signal and a second port signal as a function of the first port signal and the second port signal. Once port selection states are registered, the tracking control may no longer be needed. The example design may not compromise performance while reducing variation between pulse latches and reducing area impact.

In an example design, to reduce the impact of variations between pulse latches on a die, a pulse latch's latching speed may be linked between different ports. More particularly, selection signals for two or more ports may be configured such that the voltages of the selection signals for the two or more ports are equal or nearly equal at various switching times. For example, a switch may be used to short the ports together to ensure that there is minimal variance, e.g., in the voltage of the port selection signals until the port selection signals are registered or stored, e.g., in a memory such as cross coupled inverters. The switch may be activated, for example, prior to a switching on each of two or more port selection signals.

In one example, two port selection signals may be in an inactive state. The two port selection signals may need to transition to an active state. Because of variations across a die used to implement a memory there may be differences in transitions of the two port selection signals. To reduce differences in the transitions, e.g., changes in logical state, of the two port selection signals, a switch may be used to short the two port selection signals together. Shorting the two port selection signals together may help to ensure that the variance between the two port selection signals during, for example, transitions of the two port selection signals to active states, e.g., from inactive states, is reduced. The switch may be activated, for example, prior to a switching on each of two or more port selection signals to an active state. Accordingly, assuming the two port selection signals are both inactive and active at the same voltage levels, the two port selection signals may tend to switch from inactive states to active states closer together because signals transition from the same starting voltage level. The scheme described above would not generally be used with two signals that do not share the same voltage levels for active states and voltage levels for inactive states.

Figure 1:
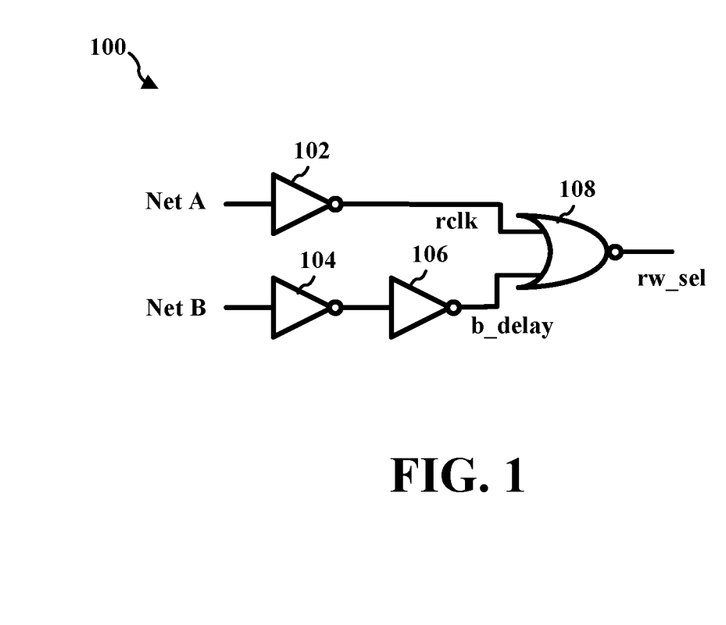
FIG. 1 is an example read/write address multiplexing selection circuit.

FIG. 1 is an example read/write address multiplexing selection circuit 100. The example read/write address multiplexing selection circuit 100 includes inverters 102, 104, 106 and NOR gate 108. A first signal (Net A) may be inverted by inverter 102 to generate a clock signal (rclk) that may be connected to a first input of the NOR gate 108. A second signal (Net B) may be buffered and delayed by a pair of inverters, inverters 104, 106, to generate a delay signal (b_delay) that may be connected to a second input of the NOR gate 108. The NOR gate 108 may generate a read/write select signal (rw_sel) at the output of the NOR gate 108. Accordingly, the read/write select signal (rw_sel) at the output of the NOR gate 108 will be a logic "1" when Net A is a logic "1" and Net B is a logic "0." The read/write select signal (rw_sel) at the output of the NOR gate 108 will be a logic "0" when Net A and Net B are both logic "1" and when Net A is a logic "0." Net A and Net B may begin a memory access cycle with each signal pulled low. Accordingly, the read/write select signal (rw_sel) at the output of the NOR gate 108 will be a logic "0," which may indicate a selection of a read address. Conversely, a high on the read/write select signal (rw_sel) may select a write address. The circuit of FIG. 1 and the status of the signals discussed above are examples. Other circuits and other signal statuses may be used to implement the systems and methods described herein.

Pulse latches may include read/write address multiplexing selection circuitry, such as the read/write address multiplexing selection circuit 100 illustrated in FIG. 1. The read/write address multiplexing selection circuit 100 illustrated in FIG. 1 may be used to control read and write address multiplexing. For example, the read/write address multiplexing selection circuit 100 may generate a read/write select signal (rw_sel), which, as described above, may select a read address when low and select a write address when high.

For example, when two ports are in operation, e.g., a port A and a port B, at the beginning of a memory access cycle, Net A and Net B may be pulled down, e.g., to a logic low ("0"). Accordingly, the read/write address multiplexing selection circuitry may select the read address initially, e.g., when Net A and Net B are pulled down.

However, variations may be present in the pulse latch control circuitry, such as the example read/write address multiplexing selection circuit 100 illustrated in FIG. 1 that may be part of the pulse latches. Because variations may be present in pulse latch control circuitry, Net A and Net B may not pull down, e.g., to a logic "0", in the same amount of time. For example, one signal, e.g., Net A, may pull down, e.g., to a logic "0," faster than another signal, e.g., Net B, or conversely Net B may pull down, e.g., to a logic "0," faster than Net A pulls down, e.g., to a logic "0." When Net A is high and Net B is low, which may occur momentarily when Net B pulls down faster than Net A, the output of the NOR gate 108 is a logic high, e.g., "1." Accordingly, the read/write select signal (rw_sel), which is a function of Net A and Net B, as illustrated in FIG. 1, may glitch high if Net B discharges, e.g., pulls down, faster than Net A.

When both Port A and port B are selected, Net A and Net B may be pulled down, e.g., to a logic "0," at different rates due to local environment, loading, and/or layout effects. In other words, the local environment of a portion of a die including a port, loading of the ports, and/or the layout of port circuitry may impact transition rates of Net A and Net B. Two different signals, e.g., Net A and Net B, may act differently, even on the same die because even on a single die, the portion of a die including a port, current flow of signals near the port, and/or the layout of those signals may impact the function of the net signals, e.g., Net A and/or Net B. When the difference in pull down rates between Net A and Net B is large enough, there may be a functional glitch in the memory. The glitch may cause a write only state to be incorrectly selected. The glitch problem may be worse when the logic power supply voltage is low and memory power supply voltage is high, e.g., in dual voltage systems with a lower voltage on the logic and a higher voltage on the memory. For example, when the read/write address multiplexing selection circuit 100 is powered by a lower logic power supply there may be a smaller voltage differences between a logic "0" and a logic "1." Accordingly, a glitch may be more likely because a smaller difference in voltages between Net A and Net B, e.g., when dropping from a logic "1" to a logic "0," may be interpreted as the two different logic states, e.g., logic "0" and logic "1."

Additionally, the differences between how quickly a signal may change from one logical state to another, e.g., a pull down rate for a transition from a logic "1" to a logic "0," between Net A and Net B may be worse in designs using silicon, when compared to other materials that may be used to create electronic circuitry. The example design of FIG. 1 may provide a three sigma of confidence level for correct functionality of the circuit.

Figure 2:
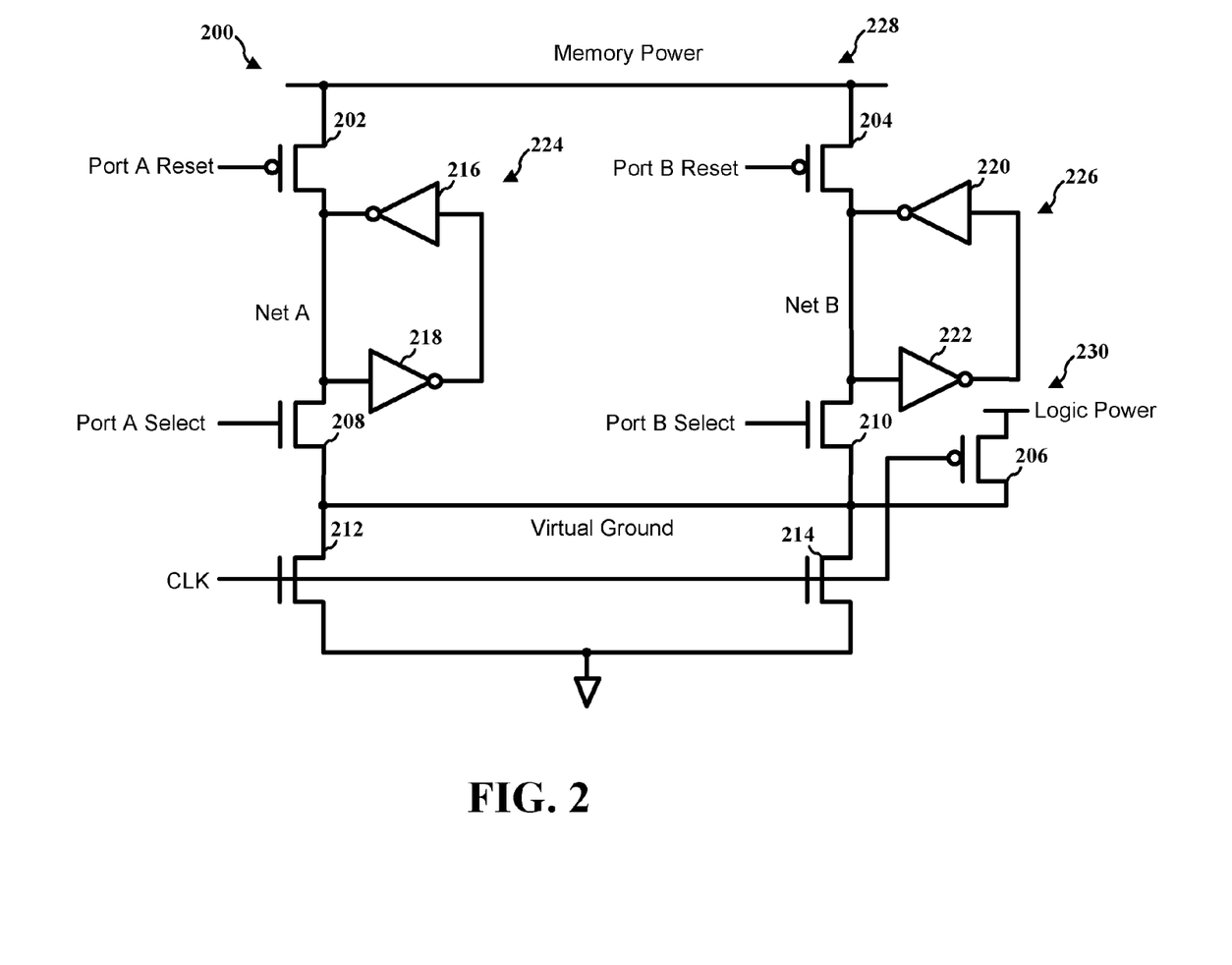
FIG. 2 is a diagram illustrating an example pulse latch.

FIG. 2 is a diagram illustrating an example pulse latch 200. The example pulse latch 200 includes several p-channel metal-oxide-semiconductor (PMOS) field-effect transistors, also referred to as a PMOS transistors, 202, 204, 206 and several n-channel metal-oxide-semiconductor (NMOS) field-effect transistor, also referred to as a NMOS transistors, 208, 210, 212, 214. The example pulse latch 200 includes several inverters 216, 218, 220, 222. The inverters 216, 218 form a set of cross coupled inverters 224. The inverters 220, 222 also form a set of cross coupled inverters 226. The cross coupled inverters 224, 226 may each form a memory cell, e.g., an SRAM memory cell. For example, the cross coupled inverters 224, 226 may each form a single bit SRAM memory cell.

The pulse latch 200 may have a portion, e.g., a memory portion 228, that is powered by a memory power supply and a portion, e.g., a logic portion 230, that is powered by a logic power supply. The memory portion 228 may include the PMOS transistors 202, 204; the NMOS transistors 208, 210, 212, 214; and the inverters 216, 218, 220, 222. The logic portion 230 may include the PMOS transistor 206 and the NMOS transistor 212. The NMOS transistor 212 may be shared by the memory portion 228 and the logic portion 230. For example, as illustrated in FIG. 2, the NMOS transistor 212 is connected to both the NMOS transistor 208 in the memory portion 228 and the PMOS transistor 206 in the logic portion 230. Accordingly, the NMOS transistor 212 may be considered to be shared between the memory portion 228 and the logic portion 230 by virtue of the connections to the NMOS transistor 208 and the PMOS transistor 206.

As discussed above, the memory portion 228 and the logic portion 230 may have separate power sources. For example, the memory portion 228 may be connected to a memory power supply and the logic portion 230 may be connected to a logic power supply. The memory power supply and the logic power supply may not be at the same voltage. As discussed above, the difference in the speed that Net A and Net B voltages drop may be worse, e.g., due to a larger difference, when the voltage of the logic power supply is lower than the voltage of the memory power supply. Using different power supply voltages, e.g., a lower voltage for the memory portion 228, may provide for a decrease in the amount of power that the memory portion 228 uses. An actual memory device may include a large number of memory portions 228 to store large amounts of data, e.g., megabytes, gigabytes. (It will be understood, however, that the systems and methods described herein may also be applied to smaller or larger memories or systems having smaller or larger memories.) Accordingly, saving power in memory circuitry may have a relatively high impact on the power used by a system incorporating the memory.

The PMOS transistor 202 may be configured to provide a reset function to port A, e.g., using the Port A Reset signal. For example, the PMOS transistor 202 may be configured to provide a reset function to the SRAM memory cell formed by the cross coupled inverters 224, e.g., inverters 216, 218. A low voltage on the PMOS transistor 202 may turn on the PMOS transistor 202 and cause an input of the inverter 218 to be pulled to the voltage at the memory power supply causing Net A to be a logic high, even if Net A was previously at a logic low. The logic high on Net A may be inverted by the inverter 218 to create a logic low at the output of the inverter 218. The logic low at the output of the inverter 218 may be inverted by the inverter 216. Accordingly, the output of the inverter 216 may hold Net A high after the PMOS transistor 202 transitions off, e.g., when the Port A Reset signal transitions from a logic low to a logic high.

Similarly, the PMOS transistor 204 may be configured to provide a reset function to port B, e.g., using the Port B Reset signal. For example, the PMOS transistor 204 may be configured to provide a reset function to the SRAM memory cell formed by the cross coupled inverters 226, e.g., inverters 220, 222. A low voltage on the PMOS transistor 204 may turn on the PMOS transistor 204 and cause an input of the inverter 222 to be pulled to the voltage at the memory power supply causing Net B to be a logic high, even if Net B was previously at a logic low. The logic high on Net B may be inverted by the inverter 222 to create a logic low at the output of the inverter 222. The logic low at the output of the inverter 222 may be inverted by the inverter 220. Accordingly, the output of the inverter 220 may hold Net B high after the PMOS transistor 204 transitions off, e.g., when the Port B Reset signal transitions from a logic low to a logic high.

The NMOS transistor 208 may be configured to provide a select function for port A, e.g., using the Port A Select signal. For example, the NMOS transistor 208 may be configured to provide a select to the SRAM memory cell formed by the cross coupled inverters 224, e.g., inverters 216, 218. Similarly, the NMOS transistor 210 may be configured to provide a select function for port B, e.g., using the Port B Select signal. For example, the NMOS transistor 210 may be configured to provide a select to the SRAM memory cell formed by the cross coupled inverters 226, e.g., inverters 220, 222.

The NMOS transistor 212 may be configured to provide a clocking function for port A, e.g., using a clock signal, CLK. For example, the NMOS transistor 212 may be configured to provide a clock to the SRAM memory cell formed by the cross coupled inverters 224, e.g., inverters 216, 218. Similarly, the NMOS transistor 214 may be configured to provide a clocking function for port B, e.g., using a clock signal, CLK. For example, the NMOS transistor 214 may be configured to provide a clock to the SRAM memory cell formed by the cross coupled inverters 226, e.g., inverters 220, 222.

As illustrated in FIG. 2, Net A may be pulled to ground when both the Port A Select signal and the clock signal, CLK, are high. In some examples, the ground may be common to both the memory voltage domain and the logic voltage domain. Similarly, Net B may be pulled to ground when both the Port B Select signal and the clock signal, CLK, are high. Accordingly, the Port A Select signal and Port B Select signal may be used to select the associated cross coupled inverters, e.g., cross coupled inverter 224 (inverters 216, 218) and cross coupled inverter 226 (inverters 220, 222), respectively. The clock signal, CLK, may then turn on one or more of NMOS transistors 212, 214 to pull down a selected net to write a logic low value to, for example, Net A, Net B, or both Net A and Net B.

The PMOS transistor 206 in logic portion 230 may be used to bridge signals from the memory portion 228 to logic circuitry (not shown) coupled to the PMOS transistor 206. The logic circuitry may be powered by the logic power supply. The PMOS transistor 206 may be used to allow the two memory portions (e.g., cross coupled inverters 224, 226) which may operate at different supply voltages, e.g., of the memory power supply and the logic power supply, to interact.

The NMOS transistor 212 may provide clocking for the PMOS transistor 206. When the clock is a logic high, the PMOS transistor 212 may be on to generate a virtual ground. The virtual ground may ground the PMOS transistor 206. When the clock, CLK, is low, the PMOS transistor 206 may be on, which may pull the virtual ground to the voltage of the logic power supply. When the clock, CLK is high, the PMOS transistor 206 may be off. Accordingly, the virtual ground may be floating or may be pulled high depending on the states the PMOS transistor 202 and the NMOS transistor 208 and/or the PMOS transistor 204 and the NMOS transistor 210.

Figure 3A:
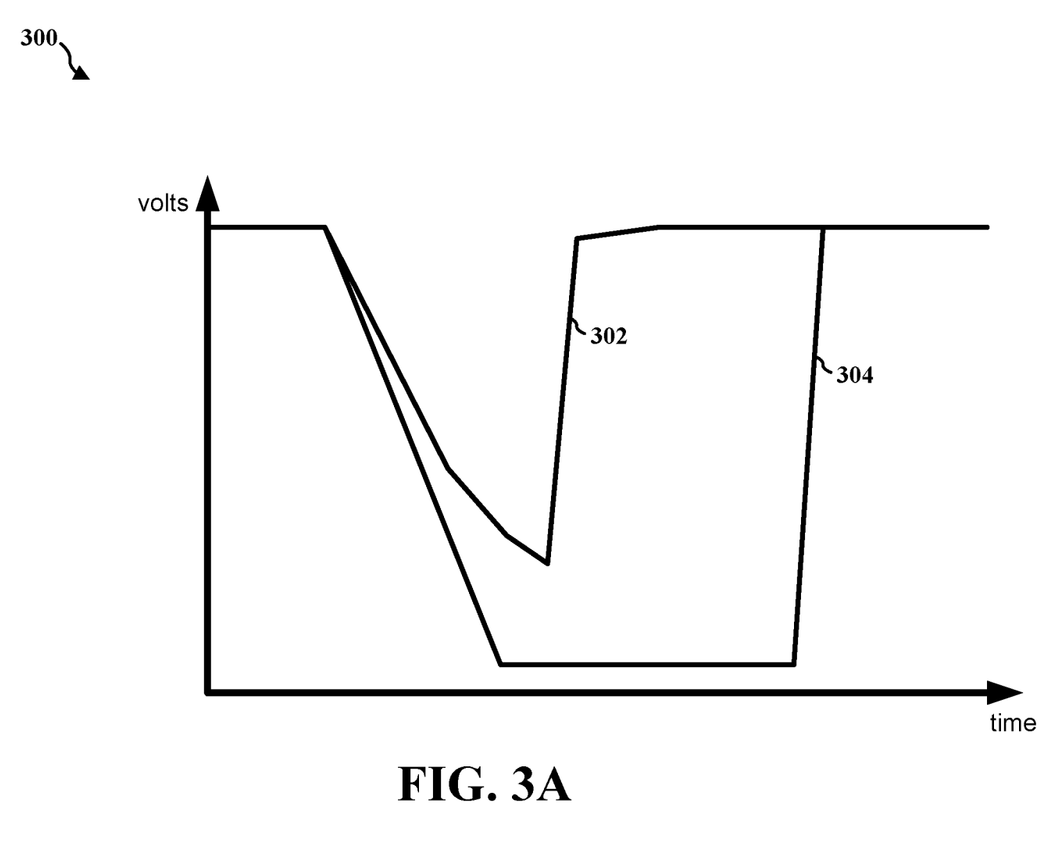
FIG. 3A is a diagram illustrating an example of pulse latch waveforms.

FIG. 3A is a diagram 300 illustrating an example of pulse latch waveforms 302, 304. The diagram 300 illustrates a first pulse latch waveform 302 and a second pulse latch waveform 304. In an example, both port A and port B may be selected. Accordingly, both Net A (waveform 302) and Net B (waveform 304) may change logical states, e.g., from a logic "1" to logic "0" in the illustrated example of FIG. 3A. As described above, Net A and Net B may pull down, e.g., to a lower voltage, at different speeds such that one may take longer to reach a certain voltage level. Net A and Net B pulling down at different speeds may be due to local environment, loading, and layout effects. For example, the voltage of the first pulse latch waveform 302 may decrease more slowly than the voltage of the second pulse latch waveform 304, as illustrated in FIG. 3A.

In the illustrated example, Net A (waveform 302) may be used to activate a memory read. Net B (waveform 304) may be used to activate a memory write. Net A (waveform 302) and Net B (waveform 304) may both transition low when both a read and a write to the memory are to occur, e.g., during a single clock cycle or a single set of clock cycles. Net A (waveform 302) and Net B (waveform 304) may both transition low at the same time to prepare the memory for both a read and a write. The read and the write may occur serially, however, e.g., one after the other in, for example, a single clock cycle. The read may complete first. Accordingly, Net A (waveform 302) may transition to a logic low and quickly or almost immediately transition back high, while Net B (waveform 304) may transition low and remain low longer than Net A (waveform 302). Additionally, the actual voltage on Net B (waveform 304) may continue to decrease for a period and then remain at a lower voltage for a period because the waveform 304 is at a logic low over a longer period.

When the difference between the voltage drop of Net A and the voltage drop of Net B is large enough, there may be functional glitches in the memory. For example, when the voltage drop of Net B is a faster voltage drop than the voltage drop of Net A, a voltage on the Net B input of the read/write address multiplexing selection circuit 100 following the voltage drop may be interpreted as a logic "0" while a voltage on the Net A input of the read/write address multiplexing selection circuit may still be interpreted as a logic "1" because of the slower change from a logic "1" to a logic "0."

Accordingly, the difference between the voltage drop of Net A and the voltage drop of Net B that may cause functional glitches in the memory may depend on the read/write address multiplexing selection circuit 100 of FIG. 1. For example, the difference between the voltage drop of Net A and the voltage drop of Net B that may cause functional glitches in the memory may depend on the voltage levels of the binary logic levels of the particular logic used to implement the read/write address multiplexing selection circuit 100 of FIG. 1. Accordingly, the difference between the voltage drop of Net A and the voltage drop of Net B that is large enough to cause functional glitches in the memory may vary.

When the difference between the voltage drop of Net A and the voltage drop of Net B is large enough to cause a functional glitch in the memory, the write only state may be incorrectly selected. The difference in the voltage drops between Net A and Net B may be worse when the logic supply voltage is low compared to the memory supply voltage, e.g., when the memory supply voltage is higher than the logic supply voltage. Additionally, as discussed above, the difference in the voltage drops between Net A and Net B may be worse in silicon, e.g., as compared to other materials used for chip fabrication.

Figure 3B:
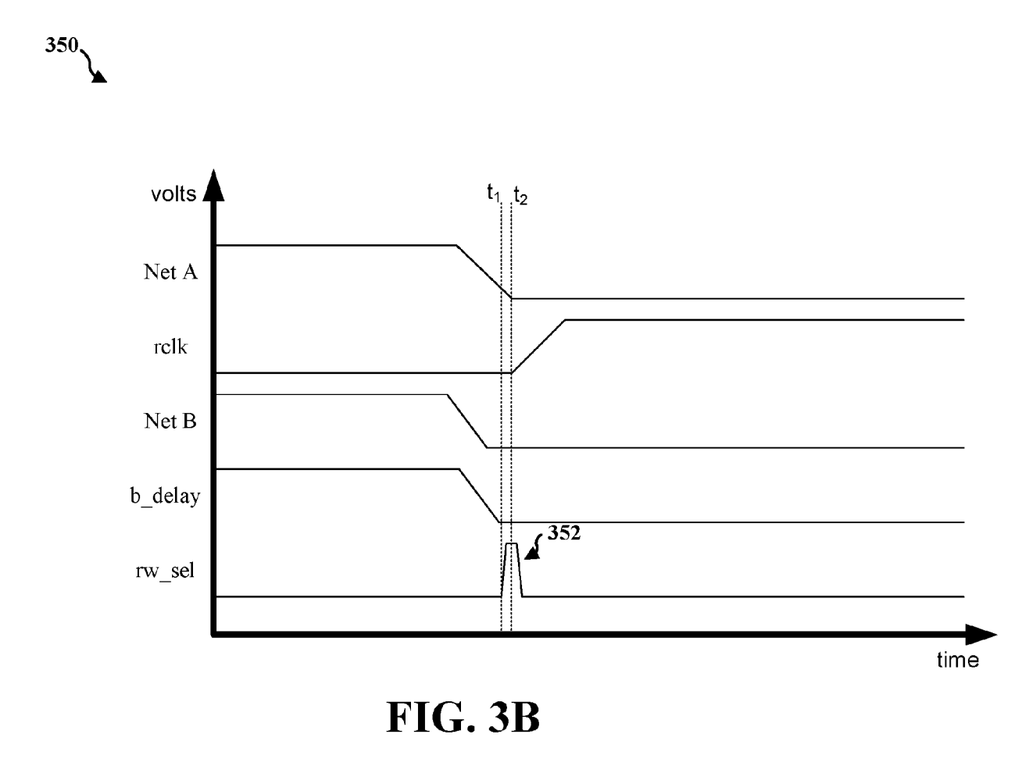
FIG. 3B is another diagram illustrating an example of pulse latch waveforms.

When Net A is high and Net B is low, which may occur momentarily when Net B (e.g., the second pulse latch waveform 304) pulls down, e.g., towards a low voltage, faster than Net A (e.g., the first pulse latch waveform 302), the output of the NOR gate 108 is a logic high, e.g., "1." Accordingly, the read/write select signal (rw_sel) may glitch high if Net B discharges faster than Net A, as illustrated in FIG. 3B.

FIG. 3B is another diagram illustrating an example of pulse latch waveforms. More specifically, FIG. 3B provides a simplified timing diagram that illustrates that the read/write select signal (rw_sel) may glitch high if Net B discharges faster than Net A. As illustrated in FIG. 3B, when Net A is high and Net B is low, which may occur momentarily when Net B pulls down, e.g., towards a low voltage, faster than Net A, read/write select signal (rw_sel) may momentarily glitch high, e.g., to a logic "1" at 352. A slow transition low by Net A may delay a rise in rclk. A fast transition low by Net B may lead to a fast transition low by b_delay. Accordingly, between time $t_1$ and time t2, rclk and b_delay may both be a logic low. The rclk and b_delay signals are inputs to the NOR gate 108. Logic low inputs to the NOR gate cause a logic high output to the NOR gate 108. Accordingly, the output of the NOR gate 108 of FIG. 1 may be high at 352, which is shifted right along the time axis to illustrate a possible delay through the NOR gate 108. The glitch on rw_sel is not desired. When Net A and Net B transition low at the same rate or nearly the same rate, no glitch should occur.

Figure 4:
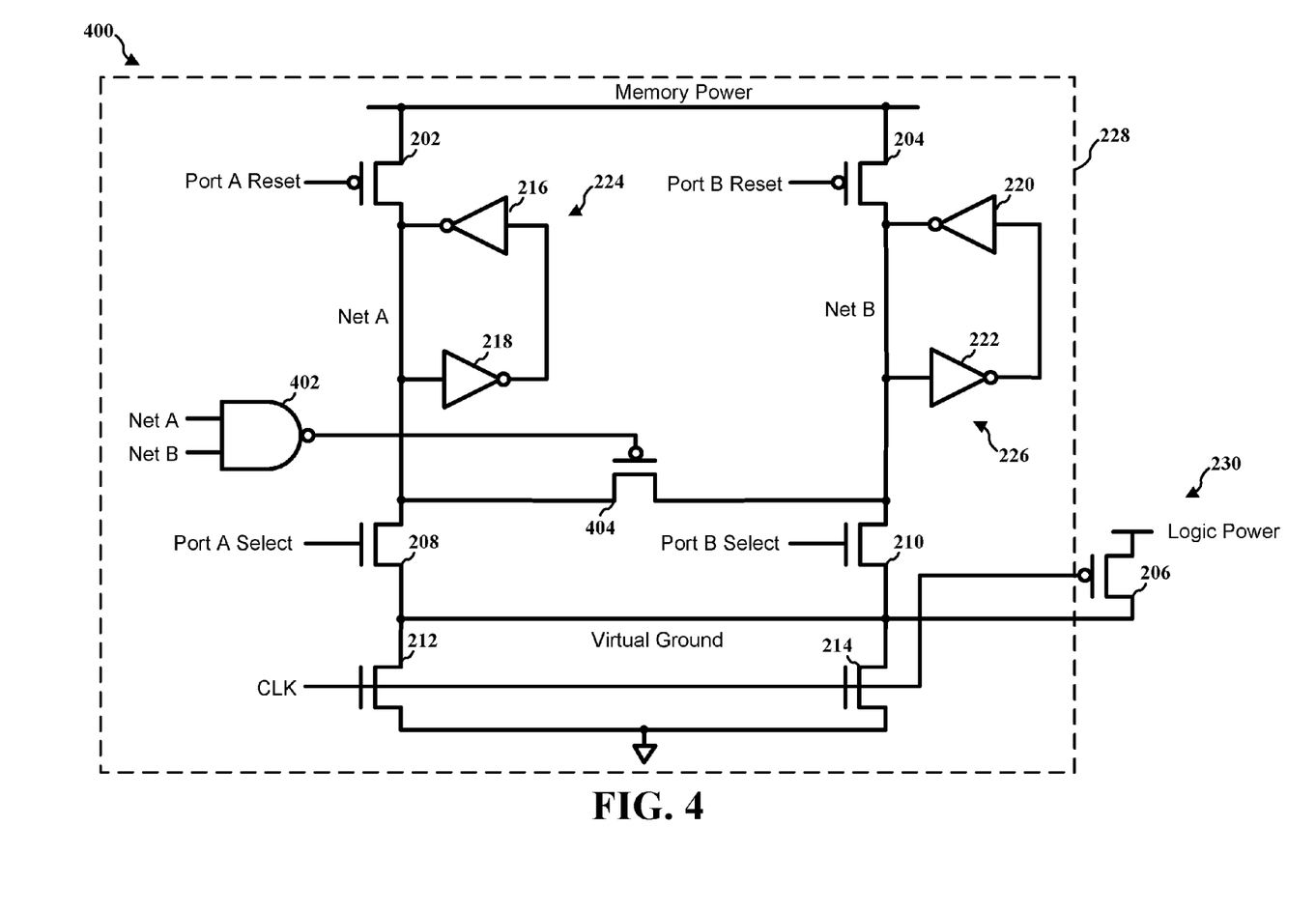
FIG. 4 is another diagram illustrating an example pulse latch.

FIG. 4 is a diagram illustrating another example pulse latch 400. The pulse latch 400 of FIG. 4 has some similarities to the pulse latch 200 of FIG. 2. For example, the example pulse latch 400 includes several PMOS transistors 202, 204, 206 and several NMOS transistors 208, 210, 212, 214. The example pulse latch 400 also includes several inverters 216, 218, 220, 222. As with the pulse latch 200, in the pulse latch 400, the inverters 216, 218 form a set of cross coupled inverters 224. The inverters 220, 222 also form a set of cross coupled inverters 226. The cross coupled inverters 224, 226 may each form a memory cell, e.g., an SRAM memory cell. For example, the cross coupled inverters 224, 226 may each form a single bit SRAM memory cell.

The pulse latch 400 may have a portion, e.g., a memory portion 228, that is powered by a memory power supply and a portion, e.g., a logic portion 230, that is powered by a logic power supply. The memory portion 228 may include the PMOS transistors 202, 204; the NMOS transistors 208, 210, 212, 214; and the inverters 216, 218, 220, 222. The logic portion 230 may include the PMOS transistor 206 and the NMOS transistor 212. Although shown within the memory portion 228, the NMOS transistor 212 may be shared by the memory portion 228 and the logic portion 230. For example, as illustrated in FIG. 4, the NMOS transistor 212 is connected to both the NMOS transistor 208 in the memory portion 228 and the PMOS transistor 206 in the logic portion 230. Accordingly, the NMOS transistor 212 may be considered to be shared between the memory portion 228 and the logic portion 230 by virtue of the connections to the NMOS transistor 208 and the PMOS transistor 206. The NMOS transistor 212 may be powered by the logic power supply and/or the memory power supply depending on the states of PMOS transistors 202, 206, NMOS transistor 208, and the output of the inverter 216.

As discussed above, the memory portion 228 and the logic portion 230 may have separate power sources. For example, the memory portion 228 may be connected to a memory power supply and the logic portion 230 may be connected to a logic power supply. The memory power supply and the logic power supply may not be at the same voltage. As discussed above, the difference in the speed that Net A and Net B voltages are pulled down, e.g., from a logic high or logic "1" voltage to a lower voltage, may be worse, e.g., have a larger difference, when the voltage of the logic power supply is lower than the voltage of the memory power supply. Using different power supply voltages, e.g., a lower voltage for the memory portion 228, may provide for a decrease in the amount of power that the memory portion 228 uses. An actual memory device may include a large number of memory portions 228 to store large amounts of data, e.g., megabytes, gigabytes. (It will be understood, however, that the systems and methods described herein may also be applied to smaller or larger memories or systems having smaller or larger memories.) Accordingly, saving power in memory circuitry may have a relatively high impact on the power used by a system incorporating the memory.

The PMOS transistor 202 may be configured to provide a reset function to port A, e.g., using the Port A Reset signal. For example, the PMOS transistor 202 may be configured to provide a reset function to the SRAM memory cell formed by the cross coupled inverters 224, e.g., inverters 216, 218. A low voltage on the PMOS transistor 202 may turn on the PMOS transistor 202 and cause an input of the inverter 218 to be pulled to the voltage at the memory power supply causing Net A to be a logic high, even if Net A was previously a logic low. The logic high on Net A may be inverted by the inverter 218 to create a logic low at the output of the inverter 218. The logic low at the output of the inverter 218 may be inverted by the inverter 216. Accordingly, the output of the inverter 216 may hold Net A high after the PMOS transistor 202 transitions to an off state, e.g., when the Port A Reset signal transitions from a logic low to a logic high.

Similarly, the PMOS transistor 204 may be configured to provide a reset function to port B, e.g., using the Port B Reset signal. For example, the PMOS transistor 204 may be configured to provide a reset function to the SRAM memory cell formed by the cross coupled inverters 226, e.g., inverters 220, 222. A low voltage on the PMOS transistor 204 may turn on the PMOS transistor 204 and cause an input of the inverter 222 to be pulled to the voltage at the memory power supply causing Net B to be a logic high, even if Net A was previously a logic low. The logic high on Net BA may be inverted by the inverter 222 to create a logic low at the output of the inverter 222. The logic low at the output of the inverter 222 may be inverted by the inverter 220. Accordingly, the output of the inverter 220 may hold Net B high after the PMOS transistor 204 transitions off, e.g., when the Port B Reset signal transitions from a logic low to a logic high.

The NMOS transistor 208 may be configured to provide a select function for port A, e.g., using the Port A Select signal. For example, the NMOS transistor 208 may be configured to provide a select to the SRAM memory cell formed by the cross coupled inverters 224, e.g., inverters 216, 218. Similarly, the NMOS transistor 210 may be configured to provide a select function for port B, e.g., using the Port B Select signal. For example, the NMOS transistor 210 may be configured to provide a select to the SRAM memory cell formed by the cross coupled inverters 226, e.g., inverters 220, 222.

The NMOS transistor 212 may be configured to provide a clocking function for port A, e.g., using a clock signal, CLK. For example, the NMOS transistor 212 may be configured to provide a clock to the SRAM memory cell formed by the cross coupled inverters 224, e.g., inverters 216, 218. Similarly, the NMOS transistor 214 may be configured to provide a clocking function for port B, e.g., using a clock signal, CLK. For example, the NMOS transistor 214 may be configured to provide a clock to the SRAM memory cell formed by the cross coupled inverters 226, e.g., inverters 220, 222.

As illustrated in FIG. 4, Net A may be pulled to ground when both the Port A Select signal and the clock signal, CLK, are high. Similarly, Net B may be pulled to ground when both the Port B Select signal and the clock signal, CLK, are high. Accordingly, the Port A Select signal and Port B Select signal may be used to select the associated cross coupled inverters, e.g., cross coupled inverter 224 (inverters 216, 218) and cross coupled inverter 226 (inverters 220, 222), respectively. The clock signal, CLK, may then turn on one or more of NMOS transistors 212, 214 to pull down a selected net to write a logic low value to, for example, Net A, Net B, or both Net A and Net B.

The PMOS transistor 206 in logic portion 230 may be used to bridge signals from the memory portion 228 to logic circuitry (not shown) coupled to the PMOS transistor 206. The logic circuitry may be powered by the logic power supply. The PMOS transistor 206 may be used to allow the two memory portions (e.g., cross coupled inverters 224, 226) which may operate at different supply voltages, e.g., of the memory power supply and the logic power supply, to interact.

The NMOS transistor 212 may provide clocking for the PMOS transistor 206. When the clock is a logic high, the PMOS transistor 212 may be on to generate a virtual ground. The virtual ground may ground the PMOS transistor 206. When the clock, CLK, is low, the PMOS transistor 206 may be on, which may pull the virtual ground to the voltage of the logic power supply.

The pulse latch 400 also includes an NAND gate 402. The Net A signal and Net B signal are inputs of the NAND gate 402. Accordingly, an output of the NAND gate 402 may be low when both the Net A signal and Net B signal are logic high values. When the output of the NAND gate 402 is low, the PMOS transistor 404 may be on and Net A and Net B may be shorted together. As the Net A signal and the Net B signal voltages begin to drop, Net A and Net B may continue to be shorted together because of delays for signal changes to propagate through the NAND gate 402. Accordingly, because Net A and Net B may be shorted together, the Net A signal and Net B signal may drop at similar rates. The Net A signal and Net B signal may drop at similar rates independent or more independent of, for example, local environment, loading, and layout effects. Accordingly, as illustrated in FIG. 4, the pulse latch 400 is an example design that may minimize between different ports, e.g., by shorting the nets associated with the two ports together. Additionally, the latch states may be fed back to the tracking control, e.g., the NAND gate 402. Once port selection states are registered, e.g., stored, by the cross coupled inverters, tracking control may no longer be needed, e.g., until the next change for example, from a logic high state to a logic low state for the Net A and Net B signals. The tracking control may short the Net A and Net B signals so that the Net A signal and Net B signal may drop at similar rates.

Figure 5:
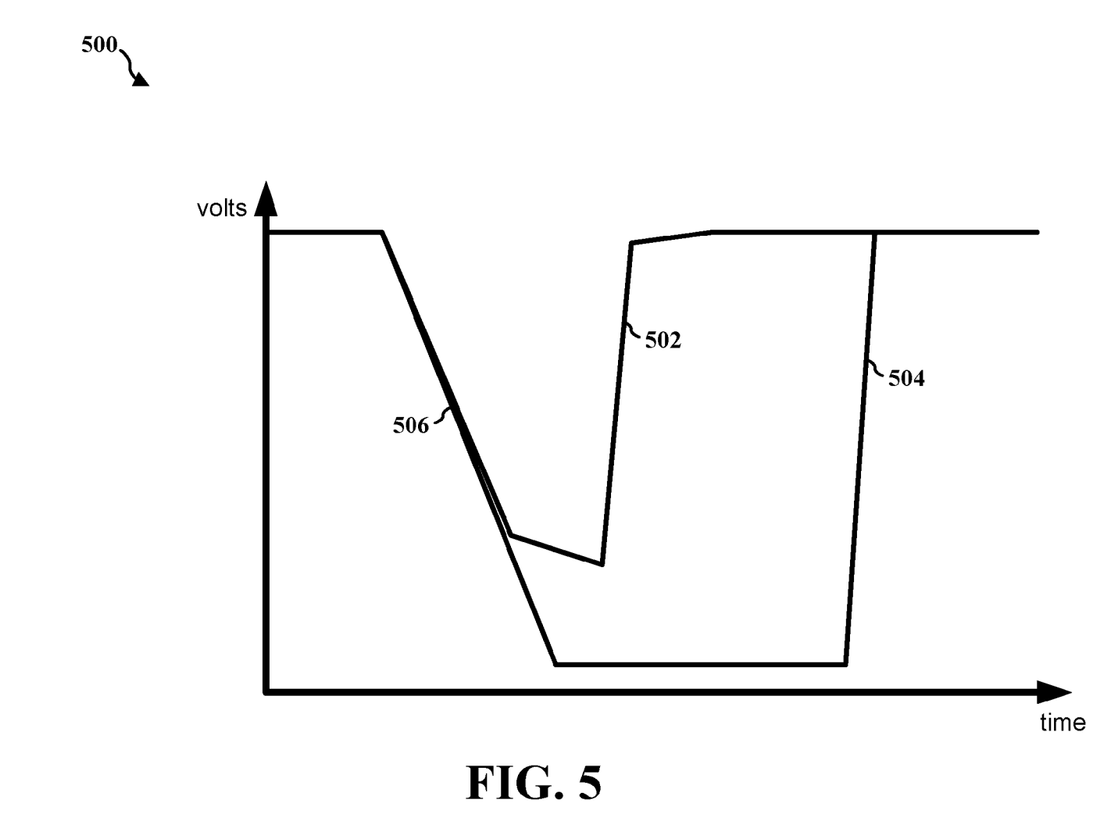
FIG. 5 is another diagram illustrating an example of pulse latch waveforms.

FIG. 5 is a diagram 500 illustrating an example of pulse latch waveforms 502, 504. The diagram 500 illustrates a first pulse latch waveform 502 and a second pulse latch waveform 504. In an example, both port A and port B are selected, e.g., as in the example of FIG. 2. In the example of FIG. 5, Net A and Net B pull down approximately together. For example, the voltage of the first pulse latch waveform 502 may decrease at approximately the same speed as the voltage of the second pulse latch waveform 504, as illustrated in FIG. 5. The voltage of the first pulse latch waveform 502 may decrease at approximately the same speed as the voltage of the second pulse latch waveform 504 by using the pulse latch 400 illustrated in FIG. 4. The pulse latch 400 may short the Net A and Net B signals so that the Net A signal and Net B signal may drop at similar rates.

In the illustrated example, Net A (waveform 502) may be used to activate a memory read. Net B (waveform 504) may be used to activate a memory write. Net A (waveform 502) and Net B (waveform 504) may both transition low when both a read and a write to the memory are to occur, e.g., during a single clock cycle or a single set of clock cycles. Net A (waveform 502) and Net B (waveform 504) may both transition low at the same time to prepare the memory for both a read and a write. The read and the write may occur serially, however, e.g., one after the other in, for example, a single clock cycle. The read may complete first. Accordingly, Net A (waveform 502) may transition to a logic low and quickly or almost immediately transition back to a logic high, while Net B (waveform 504) may transition low and remain low longer than Net A (waveform 502). In an example, after Net A transitions to a logic low value, Net B transitions to a logic low value, or both Net A and Net B transition to logic low values, Net A is no longer shorted to Net B because the logic low values may eliminate the cause of a glitch. Accordingly, because Net An and Net B are no longer shorted, Net A may transition back high soon after reaching a logic low value. The actual voltage on Net B (waveform 504) may continue to decrease for a period and then remain at a lower voltage for a period because the (waveform 504) is at a logic low over a longer period.

As illustrated in FIG. 5, Net A and Net B are now pulling down approximately together. Accordingly, because Net A and Net B are now pulling down approximately together the performance may be less likely to be compromised by layout effects, loading, and silicon variations. Accordingly, in many cases, layout effects, loading, and silicon variations will not impact the performance of Net A and Net B.

The voltage of the first pulse latch waveform 502 may decrease at approximately the same speed as the voltage of the second pulse latch waveform 504 at an area 506 of the first pulse latch waveform 502 and the second pulse latch waveform 504. The area 506 of the waveforms may be during an initial period of a drop in voltage of the first pulse latch waveform 502 and a drop in voltage of the second pulse latch waveform 504. The voltage of the first pulse latch waveform 502 may decrease at approximately the same speed as the voltage of the second pulse latch waveform 504 at the area 506 of the first pulse latch waveform 502 and the second pulse latch waveform 504 because the first port signal (e.g., the first pulse latch waveform 502) and the second port signal (e.g., the second pulse latch waveform 504) may be shorted together, e.g., during the initial period of a drop in voltage of the first pulse latch waveform 502 and a drop in voltage of the second pulse latch waveform 504 around the area 506 of the waveforms 502, 504. Shorting the first port signal and the second port signal together may cause the first port signal and the second port signal to track each other more closely, e.g., as illustrated in FIG. 5 near the area 506 of the waveforms 502, 504.

For example, an example memory controller may include a logic circuit. The logic circuit may be configured to generate a select signal for selecting between a first port and a second port of a memory. The selection between the first and the second port of the memory may be a function of the first port signal (e.g., the first pulse latch waveform 502) and the second port signal (e.g., the second pulse latch waveform 504). The example memory controller may include a switch configured to connect, e.g., short, and disconnect the first port signal (e.g., the first pulse latch waveform 502) and the second port signal (e.g., the second pulse latch waveform 504).

Figure 6:
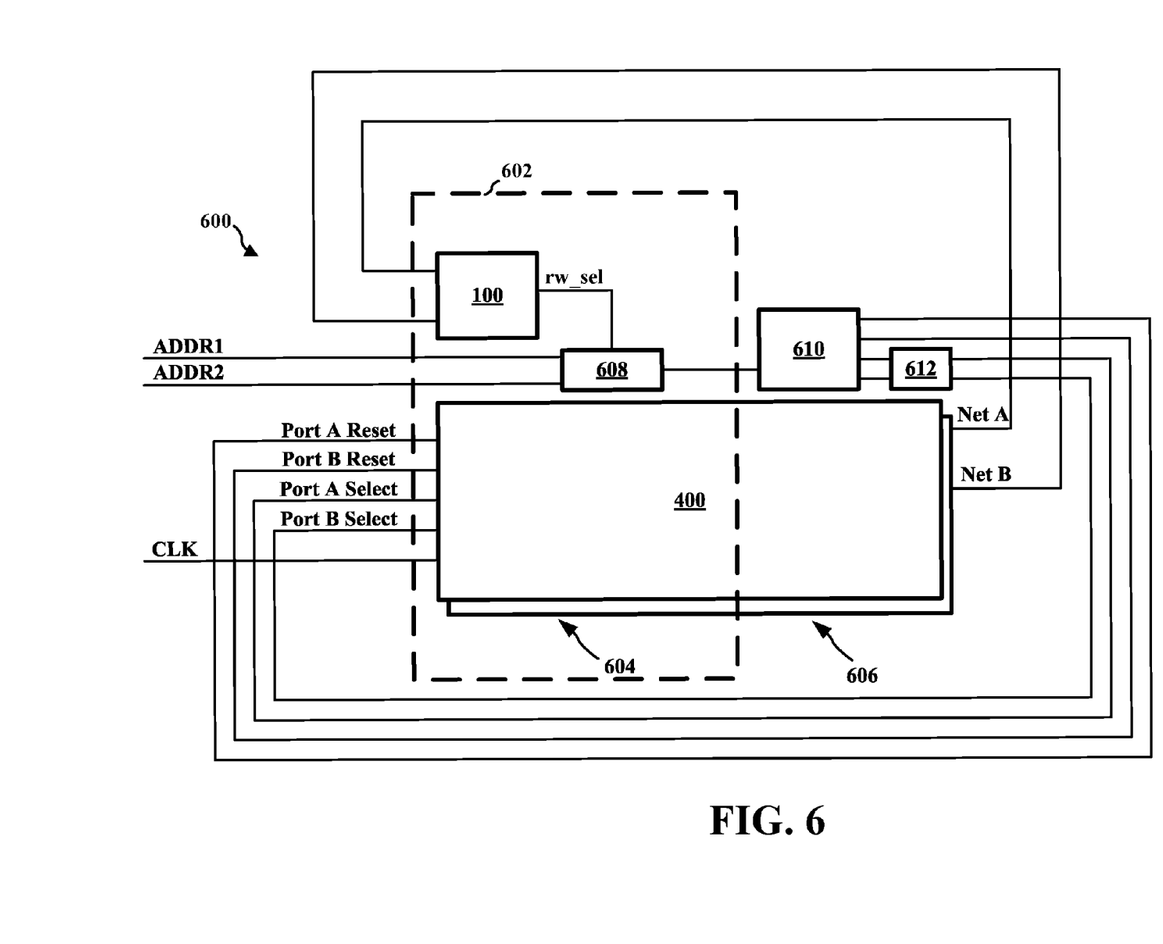
FIG. 6 is a diagram illustrating an example memory apparatus.

FIG. 6 is a diagram illustrating an example memory apparatus 600. The memory system may include a memory controller 602. The memory controller may include a logic circuit (e.g., read/write address multiplexing selection circuit 100) configured to generate a select signal (rw_sel) for selecting between a first port and a second port of a memory as a function of a first port signal and a second port signal (Net A, Net B). The memory controller may also include a switch (e.g., PMOS transistor 404 within the pulse latch 400) configured to connect and disconnect the first port signal from the second port signal (e.g., Net A, Net B, as illustrated in FIG. 4). Accordingly, the memory controller 602 may include the read/write address multiplexing selection circuit 100 of FIG. 1 and a portion 604 of the pulse latch 400. The portion 604 of the pulse latch 400 may be considered to be part of the memory controller 602. In other words, some circuits within the pulse latch 400 may be considered to be part of the memory controller 602, while other circuits in the pulse latch 400 may not be considered to be part of the memory controller. For example, the memory controller may include one or more of the NAND gate 402 and the PMOS transistor 404. The memory controller may also include one or more of the PMOS transistors 202, 204, 206; the NMOS transistors 208, 210, 212, 214. The NAND gate 402, the PMOS transistor 404, the PMOS transistors 202, 204, 206; the NMOS transistors 208, 210, 212, 214 are illustrated in FIG. 4.

Other portions 606 of the pulse latch 400 may be considered to be part of a memory in the example memory apparatus 600, rather than part of the memory controller. The other portions 606 of the pulse latch 400 are outside the memory controller 602 and separate from the portion 604 of the pulse latch 400 that may be considered to be part of the memory controller 602. For example, the inverters 216, 218, 220, 222 may be considered to be part of a memory in the example memory apparatus 600. The inverters 216, 218, 220, 222 are illustrated in FIG. 4. Referring back to FIG. 4, the inverters 216, 218 form a set of cross coupled inverters 224. The inverters 220, 222 also form a set of cross coupled inverters 226. Accordingly, the cross coupled inverters 224, 226 may each form a memory cell, e.g., an SRAM memory cell. The memory, e.g., the cross coupled inverters 224, 226, may be controlled by the memory controller 602.

In one example, the memory controller may further include a switch controller, e.g., the NAND gate 402. The switch controller may be configured to control the switch as a function of the first port signal and the second port signal. For example, the NAND gate 402, illustrated in FIG. 4, includes Net A and Net B as inputs. The output of the NAND gate 402 is coupled to the PMOS transistor 404.

In one example, the memory controller 602 may further include a multiplexer 608 configured to multiplex a first address (ADDR1) associated with the first port and a second address (ADDR2) associated with the second port based on the select signal.

In one example, the memory controller 602 may further include a latch 612 configured to latch a first port selection signal to produce the first port signal and latch a second port selection signal to produce the second port signal.

Referring back to FIG. 4, in one example, the switch comprises a transistor, e.g., PMOS transistor 404, coupled between the first port signal and the second port signal, e.g., Net A and Net B.

In one example, the latch may be part of the pulse latch 400. For example, the latch may include a reset circuit, e.g., PMOS transistors 202, 204. The reset circuit may be configured to reset each of the first and the second port signals before a memory access cycle. For example, the reset signal (Port A Reset, Port B Reset) may turn a PMOS transistor 202, 204 on, which may pull the port signal high (Net A, Net B). The memory controller may further include a port selection circuit, e.g., the NMOS transistors 208, 210. The port selection signal may be configured to set each of the first port signal and the second port signal at the beginning of the memory access cycle. For example, each port selection signals may turn one of NMOS transistors 208, 210 on. The NMOS transistors 212, 214 may be turned on at a high logic signal on the clock, e.g., which may be the beginning of the memory access cycle.

In one example, the logic circuit, e.g., the beginning of the memory access cycle, is further configured to drive the select signal (rw_sel) to a first logic state when each of the first port signal and the second port signal (Net A, Net B) are set and drive the select signal (rw_sel) to a second logic state when either of the first port signal or the second port signal (Net A, Net B) are reset.

One example may be a memory controller 602. The memory controller 602 may include a latch 612 configured to latch a first port selection signal to produce a first port signal and latch a second port selection signal to produce a second port signal. The memory controller 602 may also include a switch configured to connect and disconnect the first port signal from the second port signal.

One example may include a switch controller (e.g., NAND gate 402). The switch controller may be configured to control the switch (e.g., PMOS transistor 404) as a function of the first and the second port signals (Net A, Net B).

In one example, the switch may be a transistor (e.g., PMOS transistor 404) coupled between the first port signal and the second port signal (Net A, Net B).

For example, the latch may include a reset circuit, e.g., PMOS transistors 202, 204. The reset circuit may be configured to reset each of the first port signal and the second port signal before a memory access cycle. For example, the reset signal (Port A Reset, Port B Reset) may turn a PMOS transistor 202, 204 on, which may pull the port signal high (Net A, Net B). The memory controller 602 may further include a port selection circuit, e.g., the NMOS transistors 208, 210. The port selection signal may be configured to set each of the first port signal and the second port signal at the beginning of the memory access cycle. For example, each port selection signal may turn one of NMOS transistors 208, 210 on. The NMOS transistors 212, 214 may be turned on at a high logic signal on the clock, e.g., which may be the beginning of the memory access cycle.

One example may further include a logic circuit, e.g., read/write address multiplexing selection circuit 100. The logic circuit may be configured to generate a select signal (rw_sel) for selecting between a first port and a second port of a memory as a function of a first port signal and second port signal (Net A, Net B).

One example further includes a multiplexer 608. The multiplexer 608 may be configured to multiplex a first address (ADDR1) associated with the first port and a second address (ADDR2) associated with the second port based on the select signal.

In an example, the logic circuit, e.g., read/write address multiplexing selection circuit 100, may be further configured to drive the select signal (rw_sel) to a first logic state when each of the first port signal and the second port signal are set and drive the select signal to a second logic state when either of the first port signal or the second port signal is reset.

Another example is memory apparatus 600. The memory apparatus 600 includes memory, such as the cross coupled inverters 224, 226 within the pulse latch 400. The memory apparatus 600 also includes a memory controller 602. Additionally, the memory apparatus 600 also includes a latch 612. The latch may be configured to latch a first port selection signal to produce a first port signal and latch a second port selection signal to produce a second port signal. The memory apparatus 600 also includes a switch, e.g., PMOS transistor 404, configured to connect and disconnect the first port signal from the second port signal (Net A, Net B). Additionally, the memory apparatus 600 includes a logic circuit, e.g., the read/write address multiplexing selection circuit 100, The logic circuit may be configured to generate a select signal (rw_sel) for selecting between the first port and second port of the memory as a function of the first port signal and second port signal (Net A, Net B).

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." No claim element is to be construed under the provisions of 25 U.S.C. §112(f) unless the element is expressly recited using the phrase "means for" or, in the case of a method claim, the element is recited using the phrase "step for."

What is claimed is:

1. A memory controller, comprising:
   a logic circuit configured to generate a select signal for selecting between a first port and a second port of a memory as a function of a first port signal and a second port signal; and
   a switch configured to connect and disconnect the first port signal from the second port signal.

2. The memory controller of claim 1, further comprising a switch controller configured to control the switch as a function of the first port signal and the second port signal.

3. The memory controller of claim 1, further comprising a multiplexer configured to multiplex a first address associated with the first port and a second address associated with the second port based on the select signal.

4. The memory controller of claim 1, wherein the switch comprises a transistor coupled between the first port signal and the second port signal.

5. The memory controller of claim 1, further comprising a latch configured to latch a first port selection signal to produce the first port signal and latch a second port selection signal to produce the second port signal.

6. The memory controller of claim 5, wherein the latch comprises a reset circuit configured to reset each of the first port signal and the second port signal before a memory access cycle, the memory controller further comprising a port selection circuit configured to set each of the first port signal and the second port signal at the beginning of the memory access cycle.

7. The memory controller of claim 6, wherein the logic circuit is further configured to drive the select signal to a first logic state when each of the first port signal and the second port signal is set and drive the select signal to a second logic state when either of the first port signal or the second port signal is reset.

8. A memory controller, comprising:
   a latch configured to latch a first port selection signal to produce a first port signal and latch a second port selection signal to produce a second port signal; and
   a switch configured to connect and disconnect the first port signal from the second port signal.

9. The memory controller of claim 8, further comprising a switch controller configured to control the switch as a function of the first port signal and the second port signal.

10. The memory controller of claim 8, wherein the switch comprises a transistor coupled between the first port signal and the second port signal.

11. The memory controller of claim 8, wherein the latch comprises a reset circuit configured to reset each of the first port signal and the second port signal before a memory access cycle, the memory controller further comprising a port selection circuit configured to set each of the first port signal and the second port signal at the beginning of the memory access cycle.

12. The memory controller of claim 8, further comprising a logic circuit configured to generate a select signal for selecting between a first port and a second port of a memory as a function of the first port signal and the second port signal.

13. The memory controller of claim 12, further comprising a multiplexer configured to multiplex a first address associated with the first port and a second address associated with the second port based on the select signal.

14. The memory controller of claim 12, wherein the logic circuit is further configured to drive the select signal to a first logic state when each of the first port signal and the second port signal is set and drive the select signal to a second logic state when either of the first port signal or the second port signal is reset.

15. A storage apparatus, comprising:
   memory; and
   a memory controller comprising,
      a latch configured to latch a first port selection signal to produce a first port signal and latch a second port selection signal to produce a second port signal;
      a switch configured to connect and disconnect the first port signal from the second port signal; and
      a logic circuit configured to generate a select signal for selecting between a first port and a second port of the memory as a function of the first port signal and the second port signal.

16. The storage apparatus of claim 15, further comprising a switch controller configured to control the switch as a function of the first port signal and the second port signal.

17. The storage apparatus of claim 15, wherein the switch comprises a transistor coupled between the first port signal and the second port signal.

18. The storage apparatus of claim 15, wherein the latch comprises a reset circuit configured to reset each of the first port signal and the second port signal before a memory access cycle, the storage apparatus further comprising a port selection circuit configured to set each of the first port signal and the second port signal at the beginning of the memory access cycle.

19. The storage apparatus of claim 15, wherein the logic circuit is configured to generate the select signal for selecting between the first port and the second port of the memory as a function of the first port signal and the second port signal.

20. The storage apparatus of claim 19, further comprising a multiplexer configured to multiplex a first address associated with the first port and a second address associated with the second port based on the select signal.

21. The storage apparatus of claim 19, wherein the logic circuit is further configured to drive the select signal to a first logic state when each of the first port signal and the second port signal is set and drive the select signal to a second logic state when either of the first port signal or the second port signal is reset.

* * * * *